United States Patent
van Antwerpen et al.

(10) Patent No.: US 7,415,693 B1
(45) Date of Patent: Aug. 19, 2008

(54) METHOD AND APPARATUS FOR REDUCING SYNTHESIS RUNTIME

(75) Inventors: Babette van Antwerpen, Mountain View, CA (US); Gregg William Baeckler, San Jose, CA (US); Jinyong Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 525 days.

(21) Appl. No.: 10/851,355

(22) Filed: May 21, 2004

(51) Int. Cl.
  *G06F 17/50* (2006.01)
(52) U.S. Cl. ............................................. 716/18; 716/1
(58) Field of Classification Search ............ 716/1, 716/18
  See application file for complete search history.

(56) References Cited

U.S. PATENT DOCUMENTS

| | | | |
|---|---|---|---|
| 5,537,330 A * | 7/1996 | Damiano et al. ............... 716/18 |
| 5,805,462 A * | 9/1998 | Poirot et al. .................... 716/18 |
| 6,412,099 B1 * | 6/2002 | Chiba .............................. 716/6 |
| 6,490,717 B1 * | 12/2002 | Pedersen et al. ............... 716/18 |
| 6,519,756 B1 * | 2/2003 | Kao et al. ....................... 716/18 |
| 6,557,159 B1 * | 4/2003 | Kutzschebauch et al. ..... 716/18 |
| 6,601,024 B1 * | 7/2003 | Chonnad et al. ............... 703/14 |
| 7,082,586 B2 * | 7/2006 | Horeth et al. ................... 716/5 |
| 2002/0178432 A1 * | 11/2002 | Kim et al. ....................... 716/18 |
| 2003/0009731 A1 * | 1/2003 | Wallace .......................... 716/5 |
| 2004/0025127 A1 * | 2/2004 | Takenaka ........................ 716/5 |

* cited by examiner

*Primary Examiner*—Stacy A Whitmore
*Assistant Examiner*—Magid Y Dimyan
(74) *Attorney, Agent, or Firm*—L. Cho

(57) ABSTRACT

A method for designing a system includes caching a representation of a first subnet with a synthesis result of the first subnet. The synthesis result of the first subnet is utilized for a second subnet in response to determining that a representation of the second subnet is identical to the representation of the first subnet.

29 Claims, 10 Drawing Sheets

Cone:
0: IN
1: IN
2: IN
3: IN
4: IN
5: IN
6: IN
7: IN
8: IN
9: AND !6 !7 !8
10: AND 6 !7 !8
11: AND 6 7 !8
12: AND !6 !7 !8
13: AND 1 12
14: AND 2 10
15: AND 3 9
16: AND 4 11
17: AND 5 !9 !10 !11 !12
18: OR 13 14 15 16 17

FIG. 6B

Collapse success: yes
Collapsed cone:
0: IN
1: IN
2: IN
3: IN
4: IN
5: IN
6: IN
7: IN
8: IN
9: AND 5 8
10: AND 4 6 7 !8
11: AND 2 6 !7 !8
12: AND 3 !6 7 !8
13: AND 1 !6 !7 !8
14: OR 9 10 11 12 13

FIG. 7B

METHOD AND APPARATUS FOR REDUCING SYNTHESIS RUNTIME

FIELD OF THE INVENTION

The present invention relates to electronic design automation (EDA) tools for designing systems on programmable logic devices (PLDs). More specifically, the present invention relates to a method and apparatus for reusing synthesis results on identical subnetworks to reduce synthesis runtime.

BACKGROUND

FPGAs may be used to implement large systems that include millions of gates and megabits of embedded memory. Of the tasks required in managing and optimizing a design, performing synthesis, placement, and routing on a system design can be the most challenging and time consuming. The complexity of large systems often requires the use of EDA tools that utilize algorithms that assist in determining which components to use in a system design and how to map the components onto a physical target device. These algorithms allow the system design to satisfy area and timing constraints.

Although the design process is automated with EDA tools, generating a satisfactory system design may still be time consuming. It is an ongoing effort for EDA tool designers to shorten the runtime of its algorithms. By shortening the runtime of its algorithms, more flexibility may be offered to the system designer using the EDA tool and/or additional algorithms may be implemented in the EDA tool in order to further improve a system design.

In FPGA design, system designs are very structured in nature. It is not uncommon for a system design to include a plurality of subnetworks (subnets) that have common characteristics. Current EDA tools execute algorithms on a subnet regardless of whether an identical subnet had been previously processed. For system designs that include a large number of subnets having identical characteristics, this results in the consumption of a significant amount of time and computing resources for repetitive computations.

Thus, what is needed is an efficient and effective method and apparatus for reducing synthesis runtime.

SUMMARY

According to an embodiment of the present invention, a synthesis result from a synthesis procedure performed on a first subnet is stored in a cache. The synthesis result is stored with a representation of its corresponding subnet. When a second subnet is determined to have characteristics identical to the first subnet, the synthesis result may be utilized for the second subnet. By reusing synthesis results on identical subnets, an EDA tool can effectively reduce the runtime of a slow synthesis procedure.

BRIEF DESCRIPTION OF THE DRAWINGS

The features and advantages of the present invention are illustrated by way of example and are by no means intended to limit the scope of the present invention to the particular embodiments shown, and in which:

FIG. 6b illustrates an exemplary representation of the subnet of FIG. 6a that may be cached according to an embodiment of the present invention;

FIG. 7b illustrates an exemplary representation of the collapsed subnet of FIG. 7a that may be cached according to an embodiment of the present invention.

DETAILED DESCRIPTION

Figure 1:
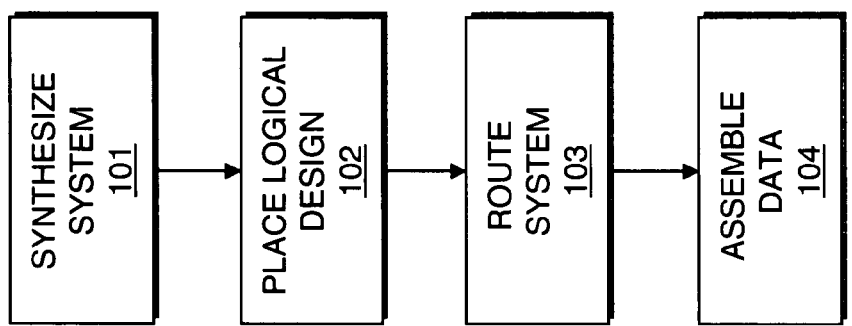
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay. During synthesis, the optimized logical design of the signal may also be mapped. Mapping includes determining how to implement components such as logic gates and other logic components in the optimized logic representation with resources available on a target device.

According to an embodiment of the present invention, subnet caching is performed during synthesis. Subnet caching involves maintaining a cache that includes a representation of subnets that are considered. With each representation of a subnet in the cache, a result of a synthesis procedure may be stored. When an identical representation of a subnet is identified, the result of the synthesis procedure may be reused. This allows bypassing the runtime that would otherwise be required for re-processing the identical subnet.

Figure 2:
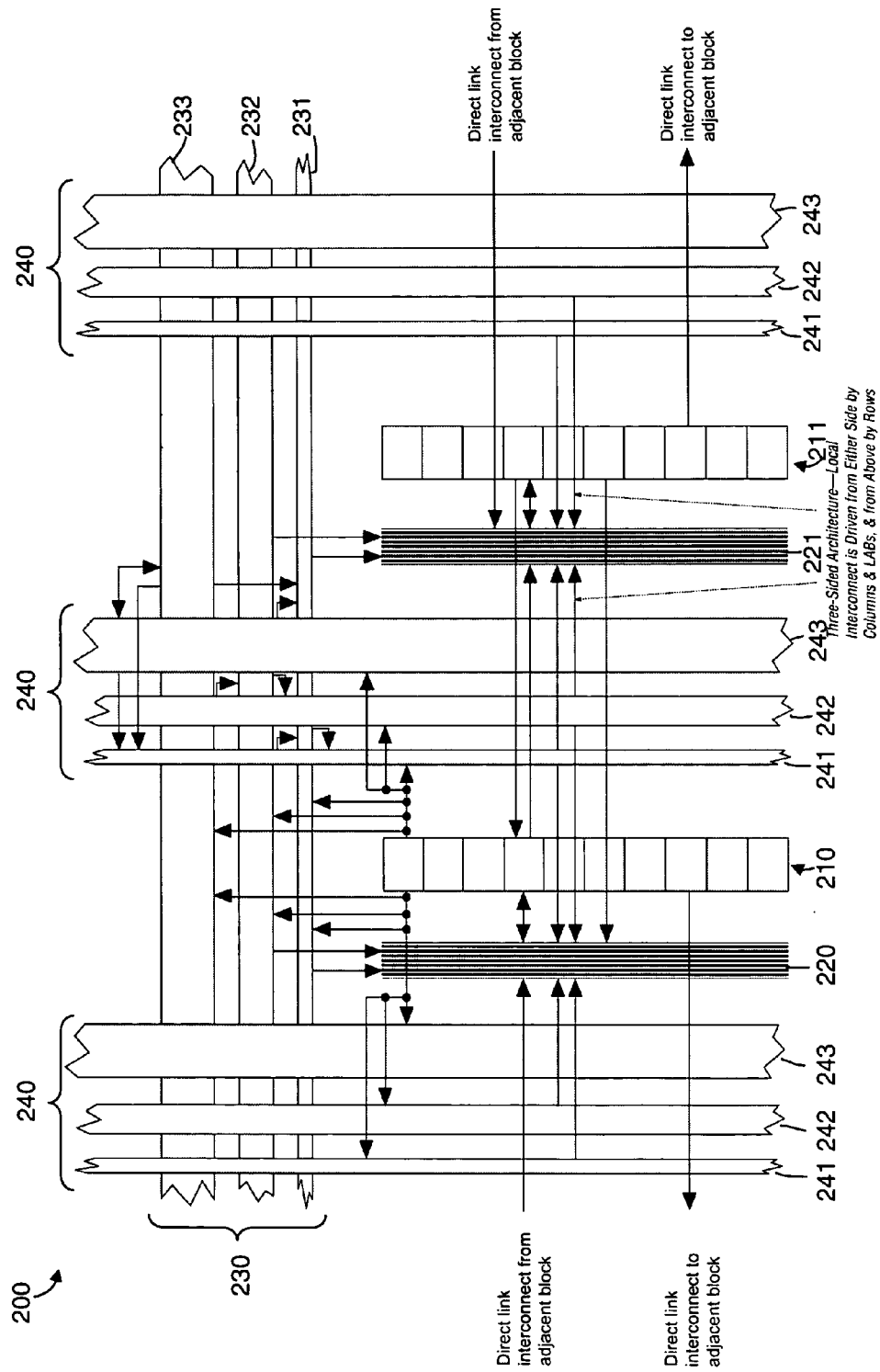
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, and Mercury™, Stratix™, and Stratix II™ family of chips and those employed by Xilinx®, Inc. in its Virtex™ and Virtex™ II line of chips.

Referring back to FIG. 1, at 102, the mapped logical system design is placed. Placement includes fitting the system on the target device by determining which resources (and their location) on the target device is to be used for specific components and connections between the components. The placement procedure may be performed by a placer in an EDA tool that utilizes placement algorithms. According to an embodiment of the present invention, a designer may provide input to the placer by specifying placement constraints. The constraints may include defining logic regions that group certain components of a system together. The size of the logic regions may be determined by the user or by a sizing method. The placement of the logic regions may be determined by the user or by a placement method.

At 103, routing of the system is performed. During routing, routing resources on the target device are allocated to provide interconnections between logic gates, logic elements, and other components on the target device. The routing procedure may be performed by a router in an EDA tool that utilizes routing algorithms.

At 104, an assembly procedure is performed. The assembly procedure involves creating a data file that includes information determined by the fitting procedure. The data file may be a bit stream that may be used to program the target device.

Figure 3:
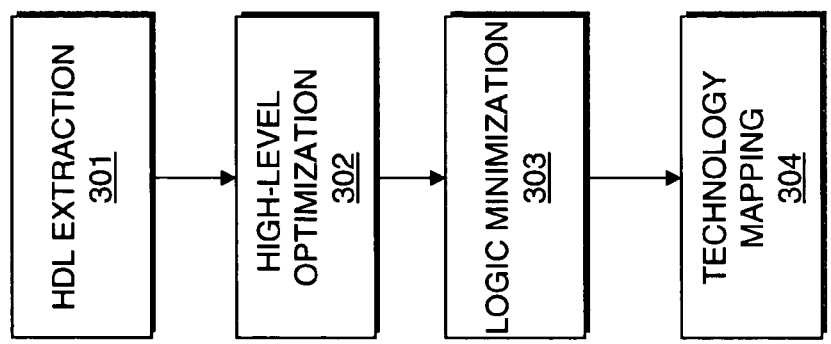
FIG. 3 is a flow chart illustrating a method for performing synthesis according to an embodiment of the present invention.

FIG. 3 is a flow chart illustrating a method for performing synthesis according to an embodiment of the present invention. The method shown in FIG. 3 may be used to implement 101 shown in FIG. 1. At 301, extraction is performed on a HDL design definition. According to an embodiment of the present invention, extraction involves translating the HDL into a synthesis netlist that includes simple logic gates, registers, and operators such as adders, multipliers, encoders, decoders, and multiplexers.

At 302, high-level optimization is performed on the synthesis netlist. According to an embodiment of the present invention, high-level optimization involves translating the synthesis netlist into simple logic gates, such as AND, OR, and XOR gates, registers, and hard blocks such as arithmetic chains, DSP blocks, and memory blocks. In one embodiment, a register transfer level (RTL) procedure is performed to optimize usage of hard blocks. The RTL procedure may search for these hard blocks to find a way to simplify them or to fit them into a piece of specialized hardware available on the target device.

At 303, logic minimization is performed on the synthesis netlist. According to an embodiment of the present invention, logic minimization involves reducing the gate count of the simple logic gates in the synthesis netlist. Logic minimization may also reduce the area required for implementing the synthesis netlist and improve the clock speed of the system.

At 304, technology mapping is performed. According to an embodiment of the present invention, technology mapping involves determining how to implement components such as simple logic gates and other logic components in the synthesis netlist with resources available on a target device. According to an embodiment of the present invention, a mapped netlist is generated from technology mapping. The mapped netlist illustrates how the resources of the target device are utilized to implement the system.

According to an embodiment of the present invention, synthesis procedures used to perform high-level optimization at 302 and logic minimization at 303 may utilize subnet caching. In this embodiment, a synthesis result from a synthesis procedure performed on a first subnet is stored in a cache. The synthesis result is stored with a representation of its corresponding subnet. The representation of the subnet may include, for example, a list of inputs and a description of components coupled to the inputs. When second subnet is determined to have characteristics identical to the first subnet, the synthesis result may be utilized for the second subnet. By reusing synthesis results on identical subnets, an EDA tool can effectively reduce the runtime of a slow synthesis procedure. It should be appreciated that the subnet may be a cone of logic or any structure having connected components of combinational logic. The subnet may also contain other elements like registers, adders, look-up tables, or pins. The synthesis result that is stored may include a result associated with a slow synthesis procedure, a sub-step in a synthesis procedure, or a combination of synthesis procedures.

Figure 4:
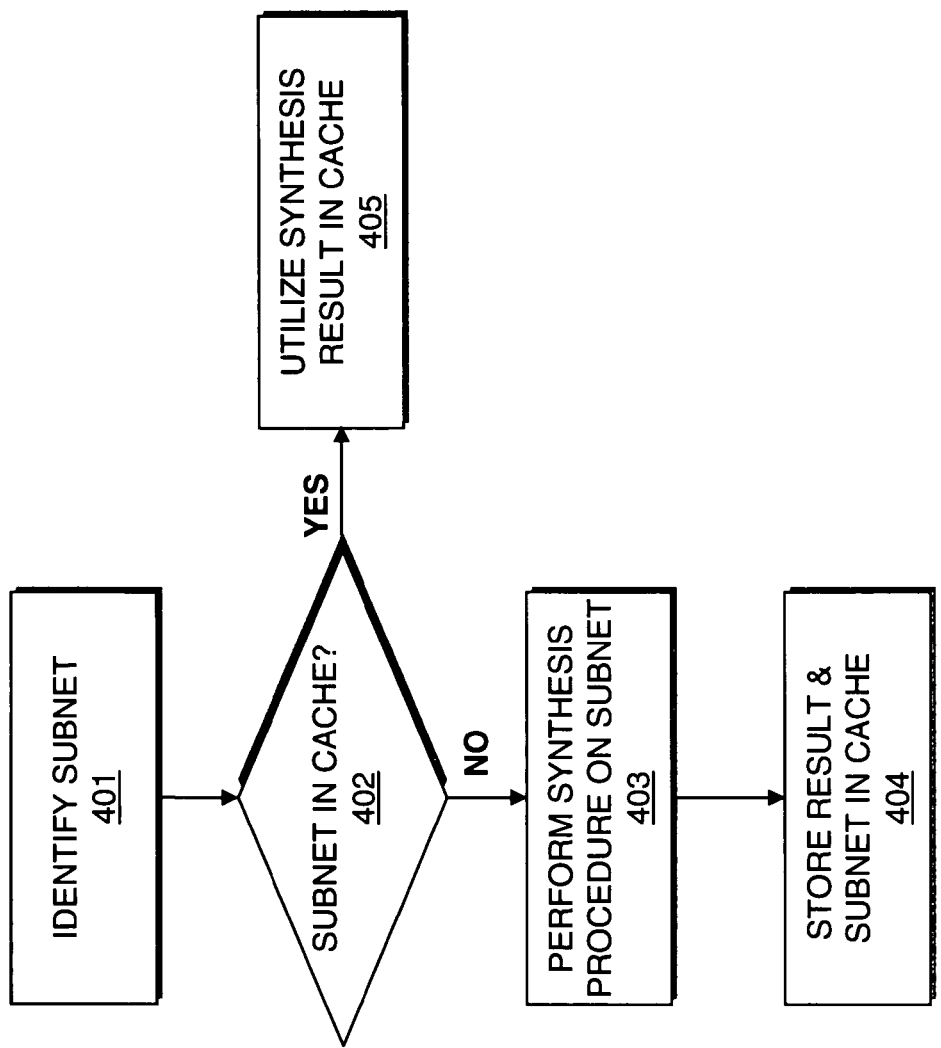
FIG. 4 is a flow chart illustrating a method for subnet caching according to an embodiment of the present invention.

FIG. 4 is a flow chart illustrating a method for subnets caching according to an embodiment of the present invention. The method shown in FIG. 4 may be utilized to implement a procedure in 302 and/or 303 shown in FIG. 3. At 401, a subnet of the synthesis netlist is identified. The identification may be done according to a synthesis procedure. According to an embodiment of the present invention, the identified subnet may include connected components of combinational logic having attributes of interest to the synthesis procedure.

At 402, it is determined whether a representation of the subnet is stored in a cache. If a representation of the subnet is not stored in the cache, control proceeds to 403. If a representation of the subnet is stored in the cache, control proceeds to 405.

At 403, the synthesis procedure is performed on the subnet.

At 404, the synthesis result is stored with a representation of its corresponding subnet in the cache.

At 405, a stored synthesis result corresponding to the representation of the subnet is utilized for the subnet.

It should be appreciated that the method for subnet caching may be utilized for synthesis or other procedures that examine a plurality of subnets with which repetition occurs. For example, according to an embodiment of the present invention, caching subnets may be utilized when performing collapse and re-factoring. In this embodiment, at 401, a cone of logic with one output and several inputs may be identified for the subnet. At 403, if the subnet has not been previously processed, the synthesis procedure may collapse the subnet into a sum-of-products. When collapse is successful, the synthesis procedure factors the sum-of-products. Collapse may be determined to be successful, for example, if the sum-of-products representation includes a number of logic gates that do not exceed a threshold value. If the new implementation of the subnet is an improvement over the original subnet, the original subnet is replaced with the new implementation. The new implementation of the subnet may be determined to be an improvement by using criteria such as a number of connectors, gate count, logic depth, or other criteria. It should be appreciated that the synthesis result stored at 404 may include information regarding whether collapse of a subnet is successful, and if so, a structure of the resulting sum-of-products. Caching this information helps reduce the runtime of the synthesis procedure since collapsing a subnet into a sum-of-products requires a significant amount of time. It should be appreciated that the synthesis result stored at 404 may alternatively include a result of factoring.

Another example where subnet caching may be used is in table-based resynthesis. In this embodiment, at 401, for each node in a synthesis netlist, the synthesis procedure identifies a cone feeding the node up to a predetermined level as a subnet. At 403, if the subnet has not been previously processed, the synthesis procedure attempts to identify a subcone of the subnet having a small number of inputs and a large number of internal nodes. The number of inputs may be bounded from above by eight, and the ratio of internal nodes to inputs may have to be at least 2.5. For a subcone identified, the synthesis procedure creates a truth-table for the subcone and attempts to re-factor it into a smaller cone with fewer internal nodes. If the new implementation of the subnet includes fewer internal nodes than the original subnet, the original subnet is replaced with the new implementation. It should be appreciated that the synthesis result stored at 404 may include information regarding whether a subcone having a small number of inputs and a large number of internal nodes is present in a subnet. According to one embodiment, the synthesis result may also indicate whether re-factoring the subcone would improve the system. Caching this information would help reduce the runtime of the synthesis procedure since identifying the subcone and re-factoring it requires a significant amount of time. It should be appreciated that the synthesis result stored at 404 may alternatively include a result of re-factoring.

Another example where subnet caching may be used is in look-up table unmapping. In this embodiment, at 401, the synthesis procedure identifies a lookup-table in the netlist. At 403, if a look-up table with the same functionality has not been previously processed, the synthesis procedure unmaps the look-up table into simple gates such as AND, OR, and XOR gates. It should be appreciated that the synthesis result stored at 404 may include information regarding the function of the look-up table and a representation of the unmapped subnet. Caching this information would help reduce the runtime of the synthesis procedure since the algorithm that unmaps the look-up table into simple gates can be slow.

FIGS. 1, 3, and 4 are flow charts illustrating embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Figure 5:
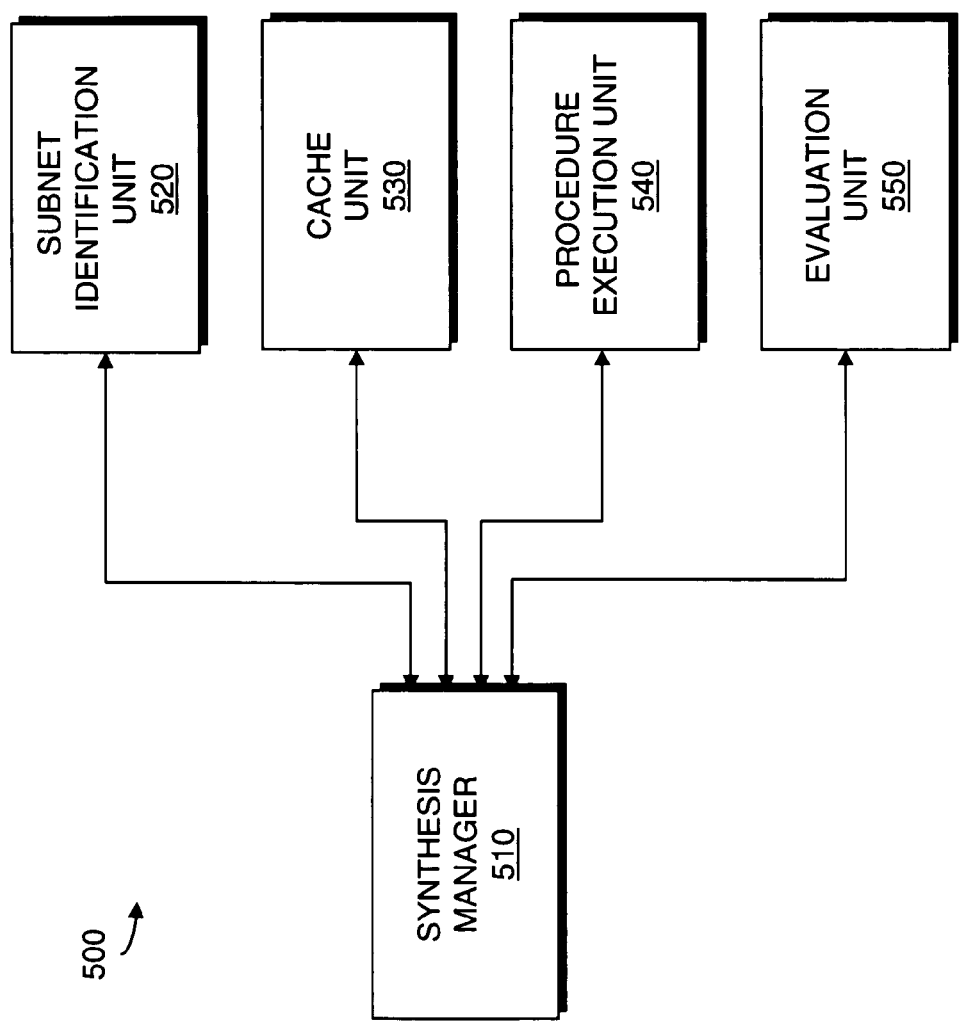
FIG. 5 is a block diagram of a synthesis unit according to an embodiment of the present invention.

FIG. 5 is a block diagram of a synthesis unit 500 according to an embodiment of the present invention. The synthesis unit 500 may be implemented in an EDA tool for performing a synthesis procedures using subnet caching. The synthesis unit 500 includes a synthesis procedure manager unit 510. The synthesis manager 510 is coupled to and manages the operation of other components in the synthesis unit 500. The synthesis manager controls the operation of a synthesis procedure.

The synthesis unit 500 includes a subnet identification unit 520. The subnet identification unit 520 identifies a subnet in a synthesis netlist to be processed according to the synthesis procedure. For example, if the synthesis procedure involves collapse and re-factoring or table-based resynthesis, the subnet identification unit 520 may identify cones of logic, possibly having a maximum predetermined depth. Alternatively, if the synthesis procedure involves look-up table unmapping, the subnet identification unit 520 may identify look-up tables. It should be appreciated that for other synthesis procedures the subnet identification unit 520 may identify other types of subnets having other types of characteristics.

The synthesis unit 500 includes a cache unit 530. The cache unit 530 stores a representation of a subnet and synthesis results corresponding to the subnet. By storing synthesis results previously generated, the synthesis results may be reused for identical subnets. The synthesis manager 510 reads from the cache unit 530 to determine whether synthesis results corresponding to a subnet is available. The synthesis manager 510 writes to the cache unit 530 to store new subnets with full or partial synthesis results for possible reuse in the future.

The synthesis unit 500 includes a procedure execution unit 540. The procedure execution unit 540 operates to process a subnet when synthesis result for the subnet is not available in the cache unit 530 for reuse. The procedure execution unit 540 processes a subnet according to the synthesis procedure. For example, if the synthesis procedure involves collapse and re-factoring, the procedure execution unit 540 may collapse a subnet into a sum-of-product and factor the sum-of-product. Alternatively, if the synthesis procedure involves table-based resynthesis, the procedure execution unit 540 may identify a subcone having a small number of inputs and a large number of internal nodes and re-factor the subcone. Alternatively, if the synthesis procedure involves look-up table unmapping, the procedure execution unit 540 may unmap the look-up table to simple logic gates.

The synthesis unit 500 includes an evaluation unit 550. The evaluation unit 550 operates to evaluate whether a new implementation of a subnet is better for a system than an original subnet. If it is determined that a new implementation of a subnet is better for the system, the synthesis manager 510 is prompted to replace the original subnet by the new implementation in the synthesis netlist.

Figure 6A:
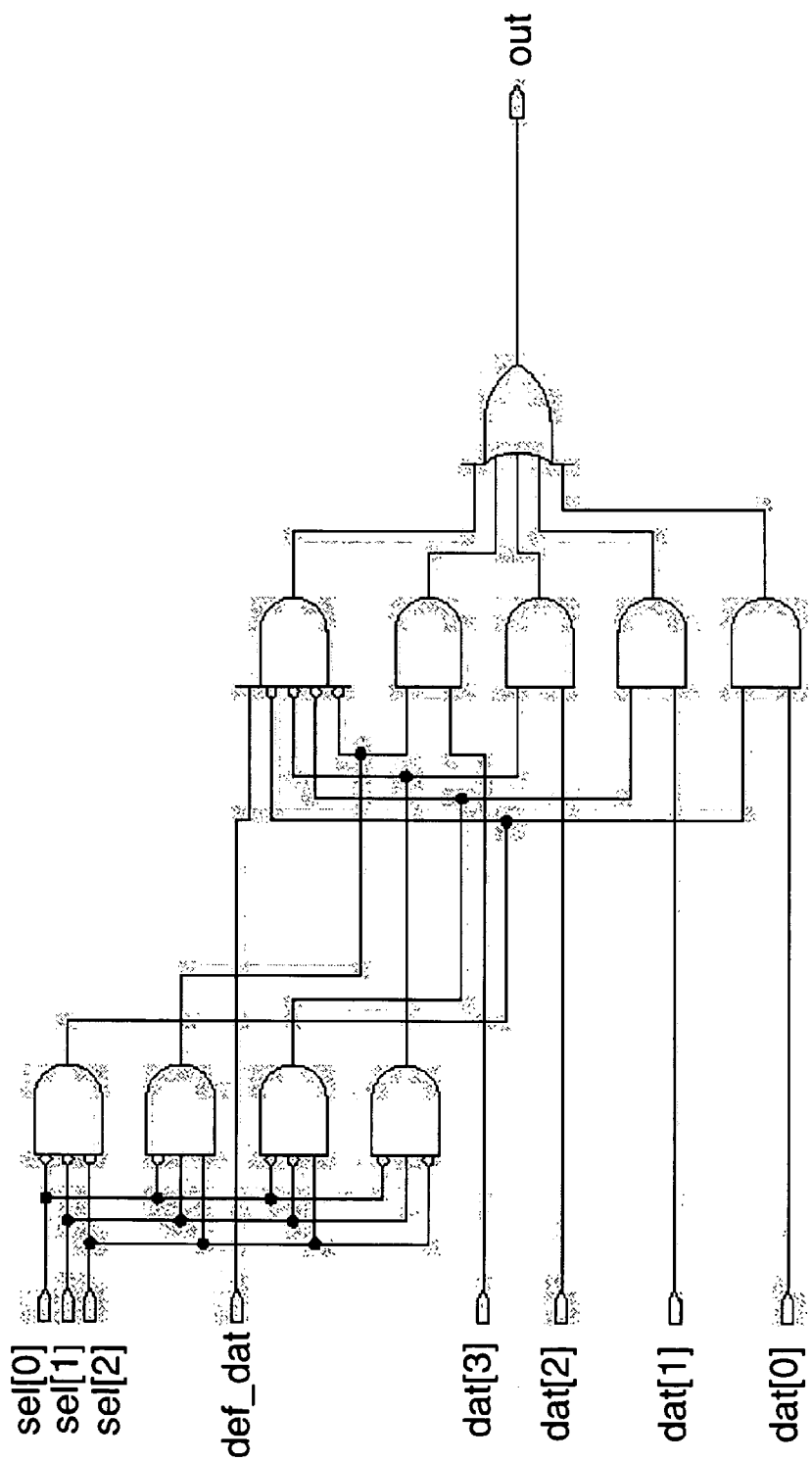
FIG. 6a illustrates an exemplary subnet according to an embodiment of the present invention.
Figure 7A:
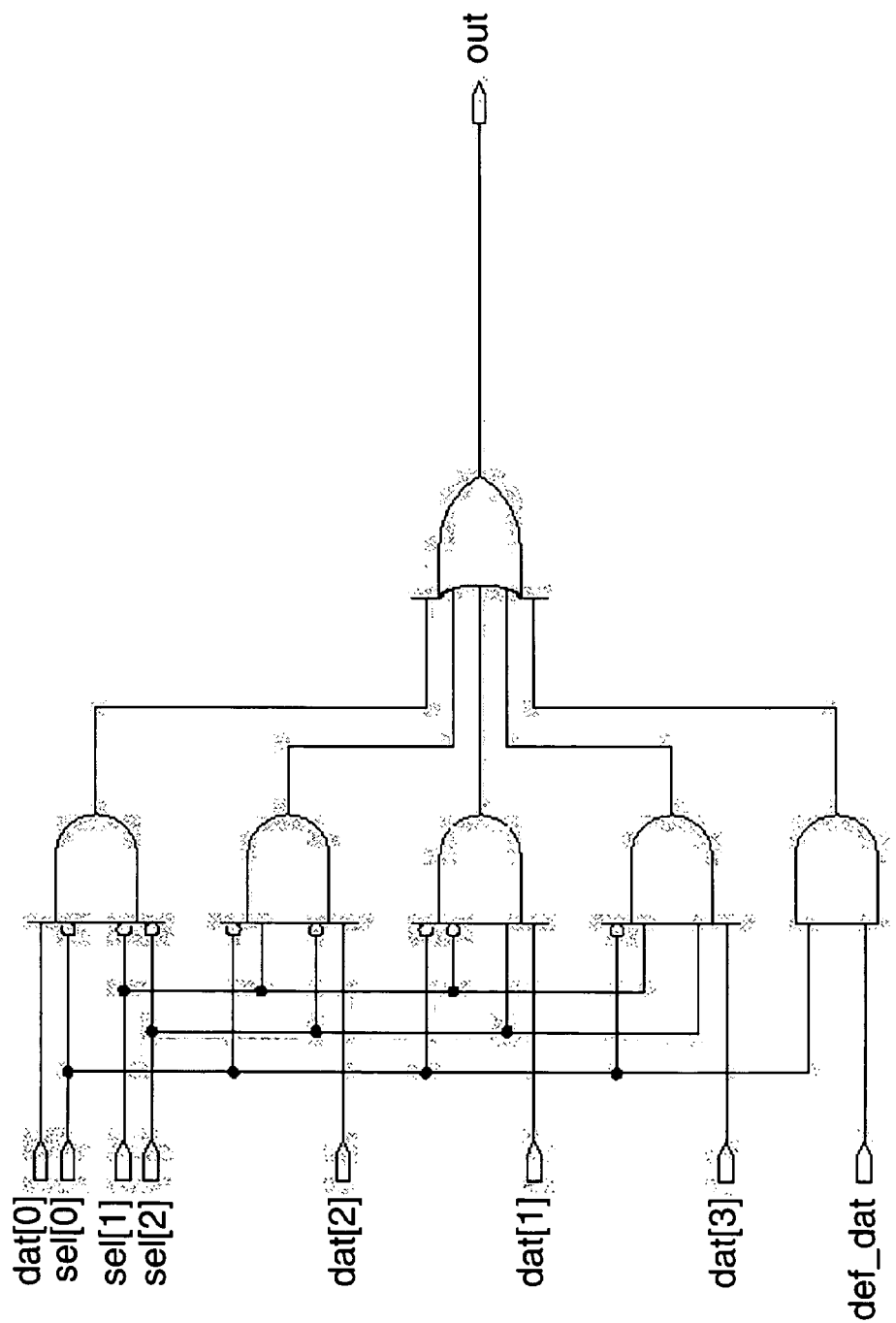
FIG. 7a illustrates the subnet of FIG. 6a after collapse according to an embodiment of the present invention.

FIG. 6a illustrates an exemplary subnet according to an embodiment of the present invention. The subnet may be identified by the subnet identification unit 520 (shown in FIG. 5) when a synthesis procedure is performing collapse and re-factoring. FIG. 6b illustrates an exemplary representation of the subnet of FIG. 6a that may be cached in the caching unit 530 (shown in FIG. 5) according to an embodiment of the present invention;

FIG. 7a illustrates the subnet of FIG. 6a after collapse according to an embodiment of the present invention. The collapse to sum-of-products may be performed by the procedure execution unit 540. FIG. 7b illustrates an exemplary representation of the collapsed subnet of FIG. 7a that may be cached as a synthesis result in the cache unit 530 according to an embodiment of the present invention.

Figure 8:
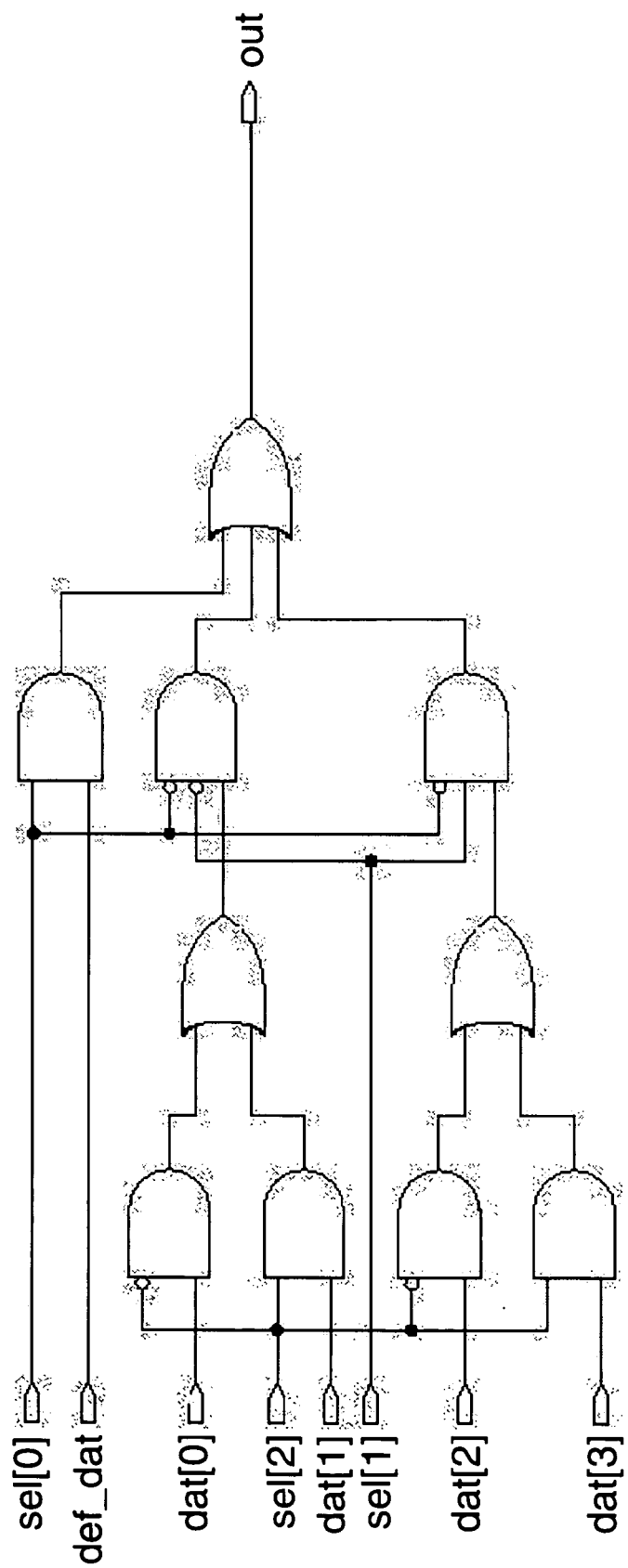
FIG. 8 illustrates the subnet of FIG. 7a after factoring according to an embodiment of the present invention.

FIG. 8 illustrates the subnet of FIG. 7a after factoring according to an embodiment of the present invention. The factoring may be performed by the procedure execution unit 540. The evaluation unit 550 will decide whether the factored subnet of FIG. 7a should replace the original subnet of FIG. 6a in the synthesis netlist.

Embodiments of the present invention (e.g. exemplary process described with respect to FIGS. 1, 3, and 4) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system, comprising:
   caching a representation of a first subnet with a synthesis result of the first subnet that describes a functionally equivalent subnet; and
   utilizing the synthesis result of the first subnet for a second subnet locatable anywhere in the system in response to determining that a representation of the second subnet is identical to the representation of the first subnet.

2. The method of claim 1, wherein the synthesis result comprises a sum-of-products representation of the first subnet.

3. The method of claim 1, wherein the first subnet comprises a cone of simple logic gates with only one output and one or more inputs.

4. The method of claim 1, further comprising identifying a subnet in a synthesis netlist.

5. The method of claim 4, wherein identifying a subnet comprises identifying a cone of logic with one output and one or more inputs.

6. The method of claim 4, wherein identifying a subnet comprises identifying a connected component of combinational logic.

7. The method of claim 4, wherein identifying a subnet comprises identifying a connected component of arbitrary elements in the synthesis netlist.

8. The method of claim 1, further comprising:
   performing a synthesis procedure on the first subnet to generate the synthesis result;
   determining whether the synthesis result is useful to the system.

9. A method for designing a system, comprising:
   determining whether a subnet with identified characteristics has been previously processed;
   performing a synthesis procedure on a first subnet with the identified characteristic in response to determining that the subnet with the identified characteristics has not been previously processed; and
   storing synthesis results associated with the synthesis procedure that describes a functionally equivalent subnet with a representation of the first subnet so that it is used for a second subnet located anywhere in the system.

10. The method of claim 9, wherein determining whether the subnet with the identified characteristics has been previously processed comprises searching a cache for a representation of the subnet.

11. The method of claim 9, wherein performing the synthesis procedure comprises collapsing the first subnet into a sum-of-products.

12. The method of claim 11, further comprising factoring the sum-of-products.

13. The method of claim 9, wherein performing the synthesis procedure comprises identifying a subcone that has a small number of inputs and a large number of internal nodes.

14. The method of claim 13, further comprising re-factoring the subcone into a smaller cone.

15. The method of claim 9, further comprising utilizing the synthesis result associated with the synthesis procedure on a second subnet in response to determining that a representation of the second subnet is identical to the representation of the first subnet.

16. The method of claim 9, wherein performing the synthesis procedure comprises unmapping a look-up table into a cone of simple gates.

17. A machine-readable medium having stored thereon sequences of instructions, the sequences of instructions including instructions which, when executed by a processor, causes the processor to perform:

caching a representation of a first subnet with a synthesis result of the first subnet, wherein the first subnet describes a cone of simple logic gates with only one output and one or more inputs; and utilizing the synthesis result of the first subnet for a second subnet in response to determining that a representation of the second subnet is identical to the representation of the first subnet.

18. The machine-readable medium of claim 17, further comprising identifying a subnet in a synthesis netlist.

19. The machine-readable medium of claim 18, wherein identifying a subnet comprises identifying a cone of logic.

20. The machine-readable medium of claim 18, wherein identifying the subnet comprises identifying a connected component of combinational logic.

21. The machine-readable medium of claim 18, wherein identifying a subnet comprises identifying a connected component of arbitrary elements in a synthesis netlist.

22. A system designer, comprising:

a procedure execution unit that executes a synthesis procedure on a first subnet in a system to generate a synthesis result that describes a functionally equivalent subnet; and a cache unit that stores the synthesis result generated by the procedure execution unit with a representation of the first subnet so that the synthesis result is used by a second subnet located anywhere in the system.

23. The system designer of claim 22, further comprising a synthesis manager that utilizes the synthesis result for the first subnet on a second subnet in response to determining that a representation of the second subnet is identical to the representation of the first subnet.

24. The system designer of claim 22, wherein the procedure execution unit generates a sum-of-products representation of the first subnet.

25. The system designer of claim 22, wherein the procedure execution unit generates an indication of whether the first subnet has a subcone with a small number of inputs and large number of internal nodes, and whether re-factoring the subcone would improve the system.

26. The system designer of claim 22, wherein the procedure execution unit generates a subnet having simple gates with the same function as the first subnet.

27. The system designer of claim 22, further comprising a subnet identification unit that identifies subnets in the synthesis netlist.

28. The system designer of claim 22, wherein the synthesis procedure unmaps a look-up table into a cone of simple gates.

29. A method for designing a system, comprising:

caching a representation of a first subnet with a synthesis result of the first subnet, wherein the first subnet describes a cone of simple logic gates with only one output and one or more inputs; and utilizing the synthesis result of the first subnet for a second subnet in response to determining that a representation of the second subnet is identical to the representation of the first subnet.

\* \* \* \* \*